(12) United States Patent
Saimen

(10) Patent No.: US 7,535,108 B2
(45) Date of Patent: May 19, 2009

(54) ELECTRONIC COMPONENT INCLUDING REINFORCING MEMBER

(75) Inventor: Munehide Saimen, Sakata (JP)

(73) Assignee: Seiko Epson Corporation (JP)

( * ) Notice: Subject to any disclaimer, the term of this patent is extended or adjusted under 35 U.S.C. 154(b) by 30 days.

(21) Appl. No.: 11/247,611

(22) Filed: Oct. 10, 2005

(65) Prior Publication Data

US 2006/0103027 A1    May 18, 2006

(30) Foreign Application Priority Data

Nov. 18, 2004  (JP)  ............................. 2004-334405

(51) Int. Cl.
*H01L 23/48* (2006.01)
*H01L 23/52* (2006.01)
*H01L 29/40* (2006.01)

(52) U.S. Cl. ..................... 257/773; 257/784; 257/774; 257/775; 257/776

(58) Field of Classification Search ......... 257/773–777, 257/784
See application file for complete search history.

(56) References Cited

U.S. PATENT DOCUMENTS

| | | | |
|---|---|---|---|
| 4,304,450 A * | 12/1981 | Bilsback et al. ................ 445/2 |
| 4,983,436 A * | 1/1991 | Bailey et al. ............... 428/40.4 |
| 5,644,006 A * | 7/1997 | Deviney et al. ............. 525/489 |
| 5,708,419 A * | 1/1998 | Isaacson et al. .......... 340/572.5 |
| 6,121,880 A * | 9/2000 | Scott et al. ............... 340/572.5 |
| 6,433,414 B2 * | 8/2002 | Saito .......................... 257/684 |
| 6,555,755 B1 | 4/2003 | Yanagisawa |
| 2001/0011763 A1 * | 8/2001 | Ushijima et al. ............. 257/668 |
| 2005/0121779 A1 | 6/2005 | Saimen |
| 2005/0168339 A1 * | 8/2005 | Arai et al. ................ 340/572.8 |
| 2005/0186702 A1 | 8/2005 | Saimen |
| 2005/0194693 A1 | 9/2005 | Saimen |
| 2006/0102382 A1 | 5/2006 | Saiment |

FOREIGN PATENT DOCUMENTS

| | | |
|---|---|---|
| JP | 05-251502 | 9/1993 |
| JP | 2000-124575 | 4/2000 |
| JP | 2000-286309 | 10/2000 |
| JP | 2005-150372 | 6/2005 |
| JP | 2005-150373 | 6/2005 |
| JP | 2005-150374 | 6/2005 |
| JP | 2006-147763 | 6/2006 |

OTHER PUBLICATIONS

Communication from Japanese Patent Office regarding counterpart application, Oct. 12, 2005.

* cited by examiner

*Primary Examiner*—Jerome Jackson, Jr.
*Assistant Examiner*—Jami M Valentine
(74) *Attorney, Agent, or Firm*—Harness, Dickey & Pierce, P.L.C.

(57) ABSTRACT

A method for manufacturing an electronic component includes: cutting a wiring substrate along a line intersecting with an outline of a reinforcing member, the wiring substrate including a base substrate, a wiring pattern provided to a first surface of the base substrate, and the reinforcing member provided to a second surface of the base substrate; and attaching a reinforcing sticker to the base substrate after cutting the wiring substrate so as to cover at least a part of a crack produced in the base substrate in cutting the wiring substrate.

13 Claims, 10 Drawing Sheets

(A)

(B)

(A)

(B)

ELECTRONIC COMPONENT INCLUDING
REINFORCING MEMBER

BACKGROUND OF THE INVENTION

1. Technical Field

The present invention relates to an electronic component and a method for manufacturing the same.

2. Related Art

Wiring substrates are known that use a substrate having a film shape. In the wiring substrate, a reinforcing plate is partially provided so that a part of the wiring substrate can be inserted into a connector or the like. A method for forming the wiring substrate is known in which a base substrate and the reinforcing plate are cut together after providing the reinforcing plate to the base substrate.

Since the reinforcing plate is partially provided to the base substrate, a part including different thicknesses is required to be cut in a process for cutting the base substrate and the reinforcing plate. Upon cutting a base substrate having different thicknesses, cracks may occur in the base substrate. In order to provide a wiring substrate having high reliability, it is preferred that the reliability is prevented from being lowered due to the occurrence of cracks. Separately from the above, the wiring substrate having high reliability can be manufactured by controlling a cutting direction.

Japanese Unexamined Patent Publication No. 2000-286309 is an example of related art.

SUMMARY

An advantage of the invention is to provide an electronic component having high reliability and a method for manufacturing the same.

(1) A method for manufacturing an electronic component according to a first aspect of the invention includes cutting a wiring substrate along a line intersecting with an outline of a reinforcing member, the wiring substrate including a base substrate, a wiring pattern provided to a first surface of the base substrate, and the reinforcing member provided to a second surface of the base substrate; and attaching a reinforcing sticker to the base substrate after cutting the wiring substrate so as to cover at least a part of a crack produced in the base substrate in cutting the wiring substrate. Accordingly, an electronic component having high reliability, which can prevent the crack from being developed since the reinforcing sticker is provided, can be manufactured.

(2) A method for manufacturing an electronic component according to a second aspect of the invention includes cutting a wiring substrate along a line intersecting with an outline of a reinforcing member, the wiring substrate including a base substrate, a wiring pattern provided to a first surface of the base substrate, and the reinforcing member provided to a second surface of the base substrate; and attaching a reinforcing sticker to the base substrate after cutting the wiring substrate so as to cover from a region in which the base substrate and the reinforcing member are overlapped to a region in which the base substrate and the reinforcing member are not overlapped. Accordingly, since the reinforcing sticker is attached to a part in which a crack easily occurs in cutting the wiring substrate, the crack does not progress even if the crack occurs. As a result, an electronic component having high reliability can be manufactured.

(3) A method for manufacturing an electronic component according to a third aspect of the invention includes cutting a wiring substrate along a line intersecting with an outline of a reinforcing member, the wiring substrate including a base substrate, a wiring pattern provided to a first surface of the base substrate, and the reinforcing member provided to a second surface of the base substrate; and removing a region from the base substrate, the region including a crack produced in cutting the wiring substrate. Accordingly, an electronic component having high reliability can be manufactured, even if the crack occurs in the base substrate.

(4) A method for manufacturing an electronic component according to a fourth aspect of the invention includes cutting a wiring substrate along a line intersecting with an outline of a reinforcing member, the wiring substrate including a base substrate, a wiring pattern provided to a first surface of the base substrate, and the reinforcing member provided to a second surface of the base substrate; and removing a part of a region from the base substrate, the part overlapping with an end part of the reinforcing member. Accordingly, since a part in which a crack easily occurs in cutting the wiring substrate is removed, the crack does not progress even if the crack occurs. As a result, an electronic component having high reliability can be manufactured.

(5) In the method for manufacturing an electronic component, a distance from an intersection of the line and the outline of the reinforcing member to the wiring pattern may be longer than a sum of a thickness of the base substrate and a thickness of the reinforcing member. Accordingly, an electronic component having high reliability, which can prevent the wiring pattern from being cut due to the crack, can be provided.

(6) In the method for manufacturing an electronic component may further include pressing a region defined by the line and an edge of the reinforcing member from the second surface side, the edge intersecting with the line, the line intersecting with a wiring being in the region in which the base substrate and the reinforcing member are overlapped, the wiring being included in the wiring pattern.

(7) An electronic component according to a fifth aspect of the invention includes a base substrate including a crack; a wiring pattern provided to a first surface of the base substrate; a reinforcing member provided to a second surface of the base substrate; and a reinforcing sticker attached to the base substrate so as to cover at least a part of the crack. Accordingly, an electronic component having high reliability, which can prevent the crack from being developed, can be provided.

(8) An electronic component according to a sixth aspect of the invention includes a base substrate including a crack; a wiring pattern provided to a first surface of the base substrate; a reinforcing member provided to a second surface of the base substrate; and a reinforcing sticker attached to the base substrate so as to cover from a region in which the base substrate and the reinforcing member are overlapped to a region in which the base substrate and the reinforcing member are not overlapped. Accordingly, since the reinforcing sticker is attached to a part in which a crack easily occurs, an electronic component having high reliability, which can prevent the crack from being developed even if the crack occurs, can be provided.

(9) An electronic component according to a seventh aspect of the invention includes a base substrate; a wiring pattern provided to a first surface of the base substrate; a reinforcing member provided to a second surface of the base substrate; and a notch formed to the base substrate, the notch exposing a corner part of the reinforcing member. Accordingly, an electronic component having high reliability can be provided.

BRIEF DESCRIPTION OF THE DRAWINGS

The invention will be described with reference to the accompanying drawings, wherein like numbers refer to like elements, wherein.

DESCRIPTION OF THE EMBODIMENTS

Embodiments according to the invention will be described below with reference to the drawings. However, the invention is not limited to the embodiments below. In addition, it should be noted that embodiments of the invention include combinations of any of embodiments and modifications that will be described below.

First Embodiment

FIGS. 1 through 9 are explanatory views illustrating a method for manufacturing an electronic component according to a first embodiment of the invention.

Figure 1:
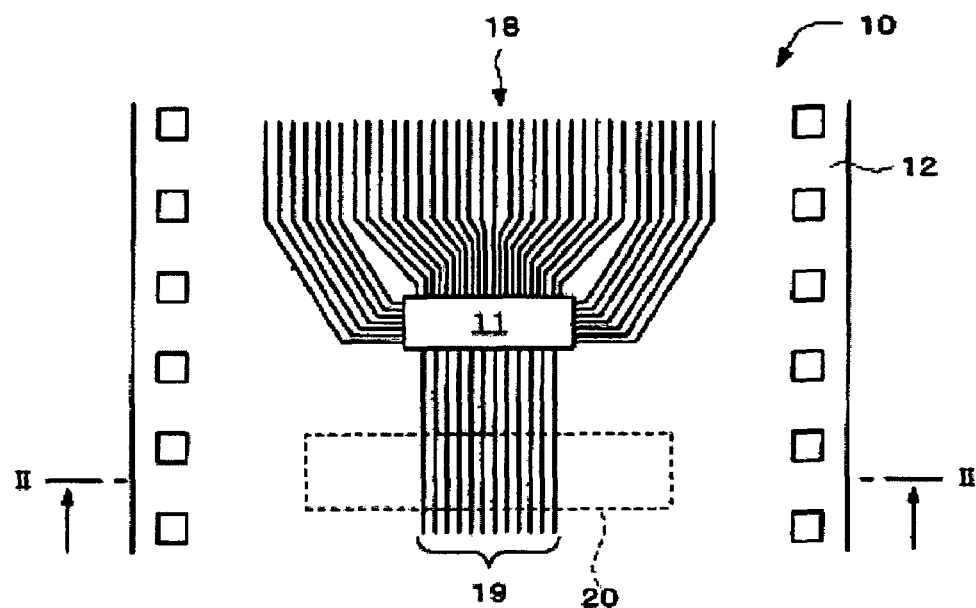
FIG. 1 is an explanatory view illustrating a method for manufacturing an electronic component according to a first embodiment of the invention.
Figure 2:
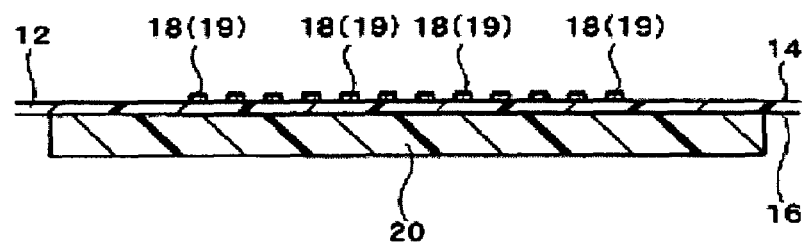
FIG. 2 is an explanatory view illustrating the method for manufacturing an electronic component according to the first embodiment of the invention.
Figure 3:
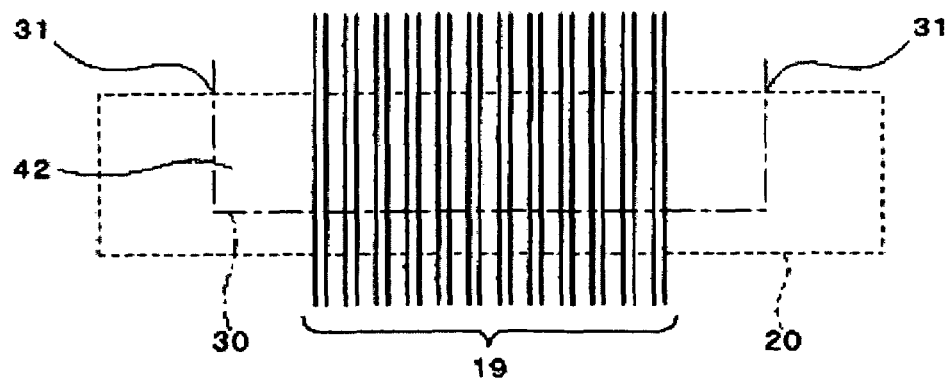
FIG. 3 is an explanatory view illustrating the method for manufacturing an electronic component according to the first embodiment of the invention.

The method for manufacturing an electronic component of the first embodiment may include a preparation of a wiring substrate 10. Below, a configuration of the wiring substrate 10 will be described. FIGS. 1 through 3 are explanatory views of the wiring substrate 10. FIG. 1 illustrates the whole shape of the wiring substrate 10. FIG. 2 is a partial enlarged view along the line II-II in FIG. 1. FIG. 3 is a partial enlarged view of FIG. 1.

The wiring substrate 10 includes a base substrate 12 (refer to FIGS. 1 and 2). The configuration or material of the base substrate 12 is not specifically limited. Any of known substrates can be used. The base substrate 12 may be a flexible substrate or a rigid substrate. The base substrate 12 also may be a tape substrate. In addition, the base substrate 12 may be a multilayered substrate or a single layer substrate. The shape of the base substrate 12 is also not specifically limited. As the material of the base substrate 12, organic materials, inorganic materials, and composite structures of them are exemplified. For the base substrate 12, for example, a substrate or film made of polyethylene terephthalate (PET) may be used. In addition, for the base substrate 12, a flexible substrate made of polyimide resin may be used. For the flexible substrate, a tape used in flexible printed circuit (FPC) or tape automated bonding (TAB) may be used. The base substrate 12 includes a first surface 14 and a second surface 16 on the side opposite to the first surface 14 (refer to FIG. 2). Here, FIG. 1 is the view of the wiring substrate 10 observed from the first surface 14.

The wiring substrate 10 includes a wiring pattern 18 (refer to FIGS. 1 through 3). The wiring pattern 18 is provided to the first surface 14 of the base substrate 12. The wiring pattern 18 may be provided only on the surface of the base substrate 10 (on the first surface 14). If a multilayered substrate is used as the base substrate 12, the wiring substrate 10 may further include a wiring (not shown) provided in the base substrate 12. If the substrate having a tape shape is used as the base substrate 12, the wiring pattern 18 may be provided to the base substrate 12 in multiple numbers (not shown). The configuration or material of the wiring pattern 18 is not specifically limited. Any of known wirings can be used. The wiring pattern 18 may be formed by a single layer of or a multilayer of any of copper (Cu), chromium (Cr), titanium (Ti), nickel (Ni), titanium tungsten (Ti—W), gold (Au), aluminum (Al), nickel vanadium (Ni—V), and tungsten (W). The wiring pattern 18 may be bonded to the base substrate 12, for example, with an adhesive. Alternatively, the wiring pattern 18 may be directly provided to the first surface 14 of the base substrate 12 (refer to FIG. 2). The wiring pattern 18 may include a plurality of wirings 19 laid in a region overlapping with a reinforcing member 20, which will be described later, (refer to FIG. 1).

The wiring substrate 10 includes the reinforcing member 20 (refer to FIGS. 1 through 3). The reinforcing member 20 is provided to the second surface 16 of the base substrate 12.

The reinforcing member 20 is the member that allows a terminal part 48 (refer to FIG. 9) of an electronic component (an electronic component 2) formed by punching out a part of the wiring substrate 10 to be inserted into a connector. The reinforcing member 20 adds its thickness to the base substrate 12, resulting in the terminal part being hardly bent. As a result, the terminal part can be inserted into the connector. The reinforcing member 20 may be bonded to the base substrate 12, for example, by pressing the reinforcing member 20 to the base substrate 12. Alternatively, the reinforcing member 20 may be bonded to the base substrate 12 with an adhesive (not shown). The material of the reinforcing member 20 is not specifically limited. For example, the same material of the base substrate 12 also may be used. Further, the shape and thickness of the reinforcing member 20 are not especially specified.

On the wiring substrate 10, a semiconductor chip 11 may be mounted (refer to FIG. 1). In this case, a cutting process described below may be carried out with a condition in which the semiconductor chip 11 is mounted.

Figure 4:
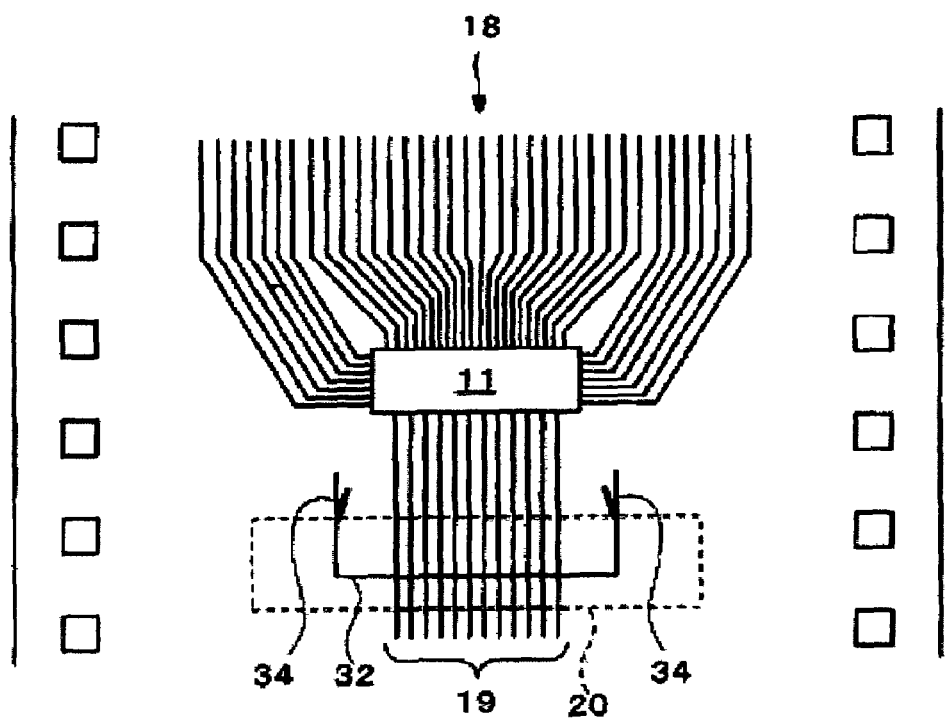
FIG. 4 is an explanatory view illustrating the method for manufacturing an electronic component according to the first embodiment of the invention.

A method for manufacturing an electronic component according to the first embodiment of the invention includes cutting the wiring substrate 10 along a line 30 shown in FIG. 3 by carrying out a cutting process on the wiring substrate 10. The cutting process may also be carried out by shearing. The cutting process also may be carried out by a press-cutting in which the substrate 10 is cut by adding a pressure on a cutting tool of Thomson molds, sculptured molds, and pinnacle molds, etc., while attaching the cutting tool to the substrate 10. The line 30 intersects with the outline of the reinforcing member 20. The intersection of the line 30 and the outline of the reinforcing member 20 may be defined as an intersection 31 (refer to FIG. 3). By carrying out the process, a cut line 32 may be formed in the base substrate 12 as shown in FIG. 4. As described above, the reinforcing member 20 is provided to the wiring substrate 10. This results in the thickness of the wiring substrate 10 being very different between a part overlapping with the reinforcing member 20 and a region outside the reinforcing member 20 (refer to FIG. 2). When the wiring substrate having different regions in thickness is cut, a force is applied to the base substrate 12 since the base substrate 12 is pulled by a cutting jig. Particularly, when the region overlapping with the reinforcing member 20 and the region outside the reinforcing member 20 are continuously cut, the force is applied to the base substrate 12. As a result, a crack 34 may occur in the base substrate 12 as shown in FIG. 4. However, the crack 34 caused by the process in the base substrate 12 may be tolerated. In other words, the cutting process may be curried out so that the crack 34 occurs in the base substrate 12. Here, the distance from the intersection 31, which is the intersection of the line 30 and the outline of the reinforcing member 20, to the wiring pattern 18 (wiring 19) may be longer than the sum of the thicknesses of the base substrate 12 and the reinforcing member 20. Accordingly, the crack 34 can be prevented from being reached to the wiring pattern 18. As a result, the wiring pattern 18 can be prevented from being cut due to the crack 34 in the cutting process, resulting in an electronic component having high reliability being manufactured. The line 30 may have both ends. That is, the cut line 32 may be provided in the wiring substrate 10 as shown in FIG. 4 without punching out the wiring substrate 10 by the process. The cut line 32 allows the wiring substrate 10 to be handled as a tape in subsequent processes. As a result, the subsequent processes can efficiently be carried out.

Figure 5:
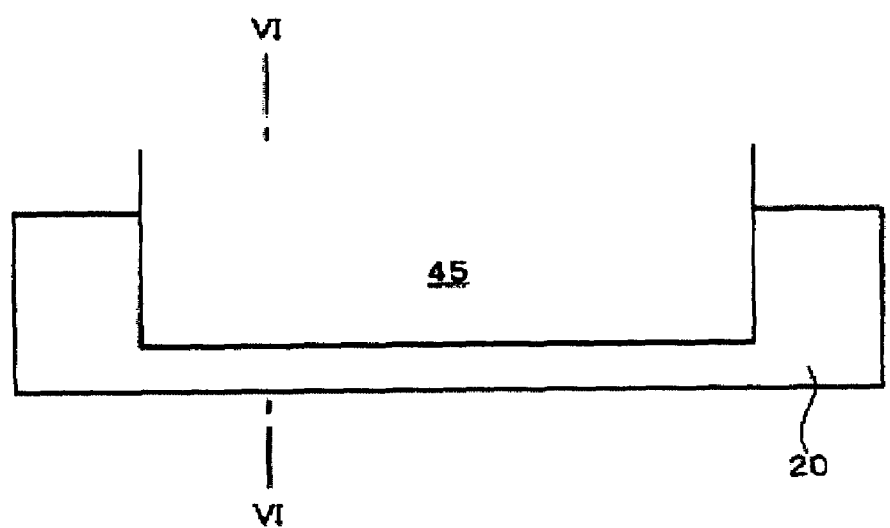
FIG. 5 is an explanatory view illustrating the method for manufacturing an electronic component according to the first embodiment of the invention.
Figure 6:
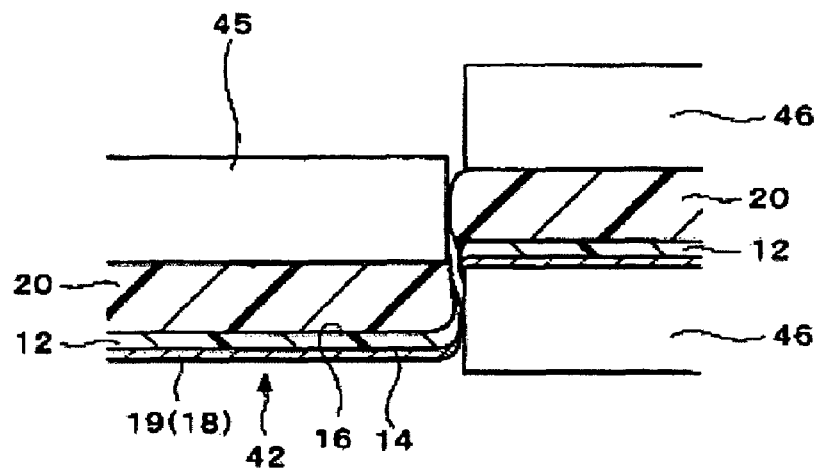
FIG. 6 is an explanatory view illustrating the method for manufacturing an electronic component according to the first embodiment of the invention.

The line 30 may intersect the wirings 19 in the region overlapping with the reinforcing member 20 as shown in FIG. 3. In this case, the wirings 19 may be cut by the cutting process. The cutting process may include pressing a region 42 from the second surface 16 side with a shearing jig 45 as shown in FIGS. 5 and 6. The region 42 is surrounded with the line 30 and the edge, which intersects with the line 30, of the reinforcing member 20. Shearing may be carried out while holding an outside region of the region 42 with a shearing jig 46 as shown in FIG. 6. Here, the region 42 is the region that serves as the terminal part 48 of an electronic component (an electronic component 2 described later) punched out from the wiring substrate 10. According to the method, the wirings 19 are cut inside the region 42 while being pressed to the base substrate 12 as shown in FIG. 6. This cutting results in the base substrate 12 and the wirings 19 being hardly delaminated at the end part of the terminal part 48. As a result, the electronic component 1 having high reliability can be manufactured. Here, FIGS. 5 and 6 are explanatory views illustrating a process for shearing the wiring substrate 10. FIG. 6 is a partially enlarged sectional view taken along the line VI-VI in FIG. 5. In FIG. 5, the shearing jig 46 is omitted.

Figure 7:
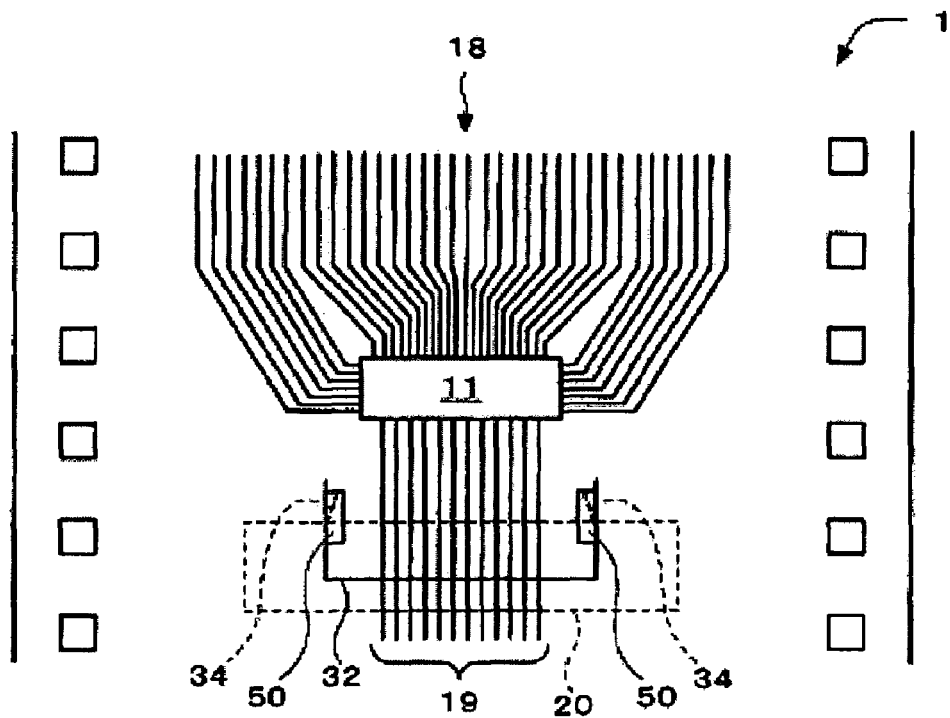
FIG. 7 is an explanatory view illustrating the method for manufacturing an electronic component according to the first embodiment of the invention.

The method for manufacturing an electronic component of the first embodiment includes attaching a reinforcing sticker 50 on the base substrate 12 so as to cover at least a part of the crack 34 produced in the base substrate 12 during the cutting process, as shown in FIG. 7. As a result, the electronic component 1 shown in FIG. 7 may be manufactured. In the electronic component 1, the base substrate 12 is reinforced with the reinforcing sticker 50. This reinforcement allows an electronic component having high reliability, which can prevent the crack 34 from being developed, to be manufactured. The reinforcing sticker 50 may be attached so as to cover the whole of the crack 34 as shown in FIG. 7. The reinforcing sticker 50 also may be attached so as to partially cover the crack 34 (not shown). The reinforcing sticker 50 may be provided so as to cover from the region in which the base substrate 12 and the reinforcing member 20 are overlapped to the region in which the base substrate 12 and the reinforcing member 20 are not overlapped. The reinforcing sticker 50 may be provided so as to overlap with at least a part of the end part of the reinforcing member 20. The reinforcing sticker 50 may be provided so that a part of the end part of the sticker 50 is along the cut line 32. The reinforcing sticker 50 may be provided so that it overlaps with a part of the reinforcing member 20, and a part of the end part of the sticker 50 is along the cut line 32. The reinforcing sticker 50 may be attached only on the first surface 14 of the base substrate 12. The reinforcing sticker 50 also may be attached only on the second surface 16 of the base substrate 12, or on both the first surface 14 and the second surface 16. The material of the reinforcing sticker 50 is not specifically limited. Any of known materials can be used. For example, the sticker made of the same material of the base substrate 12 may be used as the reinforcing sticker 50.

Figure 8:
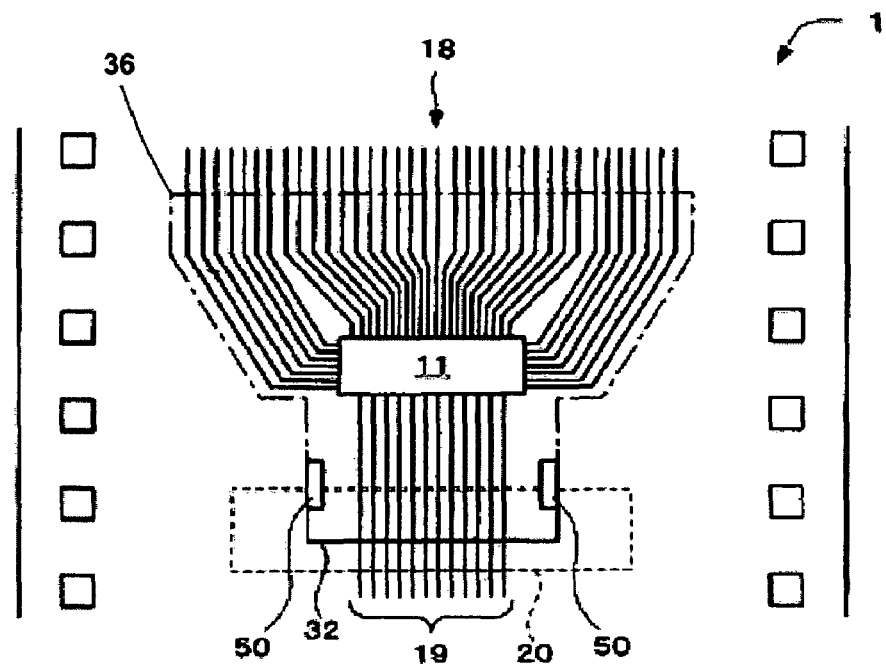
FIG. 8 is an explanatory view illustrating the method for manufacturing an electronic component according to the first embodiment of the invention.
Figure 9:
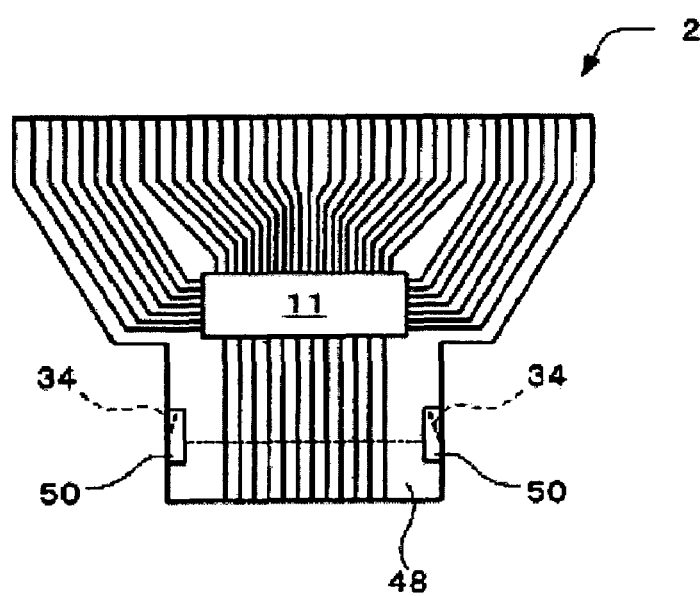
FIG. 9 is an explanatory view illustrating the method for manufacturing an electronic component according to the first embodiment of the invention.
Figure 10:
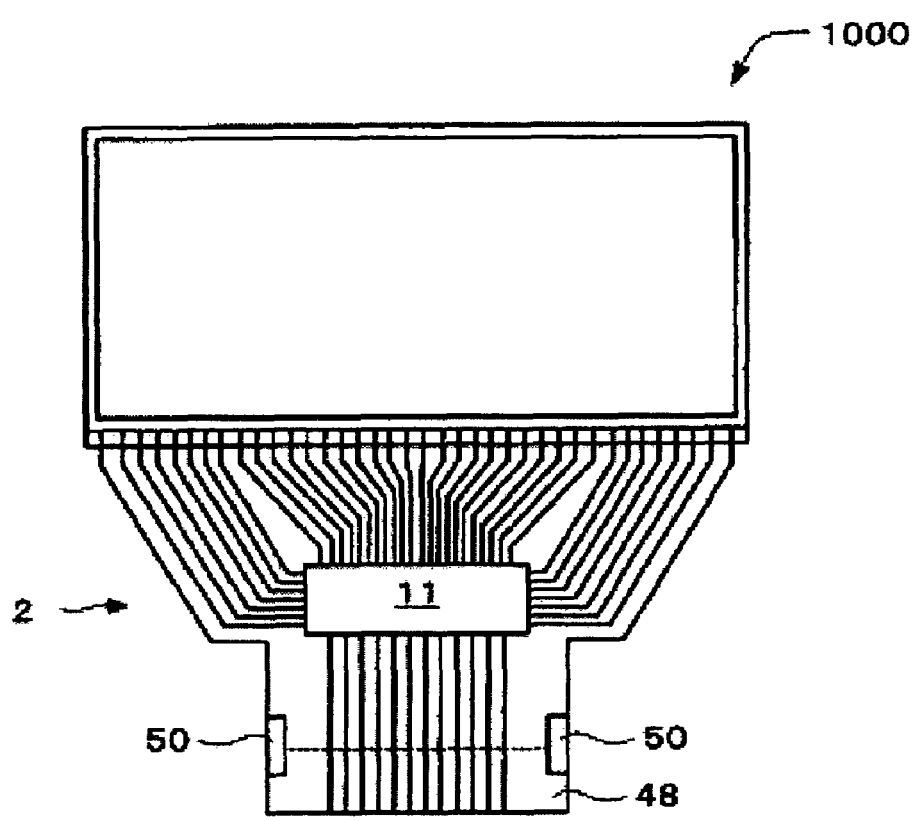
FIG. 10 is a schematic view illustrating an electronic module having an electronic component manufactured by the method of the first embodiment of the invention.
Figure 11:
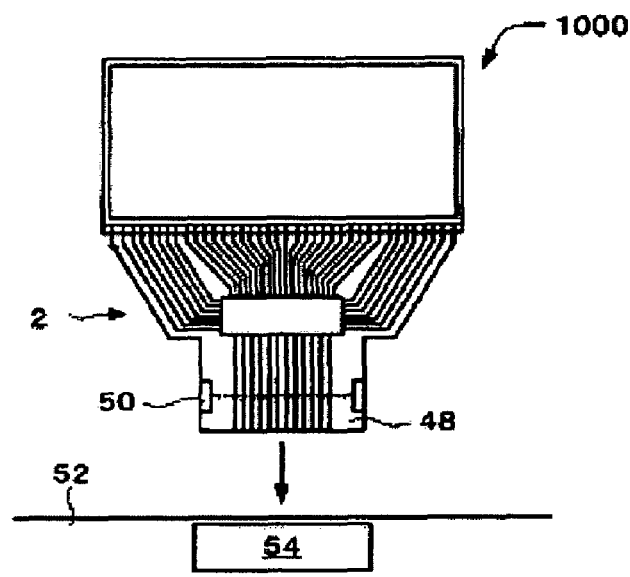
FIGS. 11A and 11B are explanatory views illustrating a method for connecting an electronic component manufactured by the method of the first embodiment of the invention to a circuit substrate.
Figure 11:
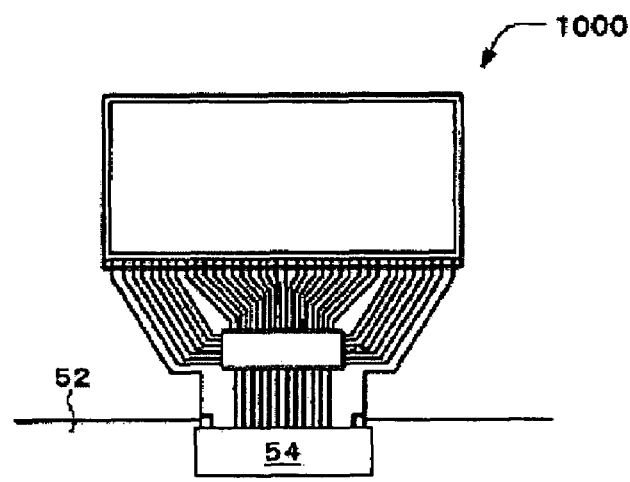
Figure 12:
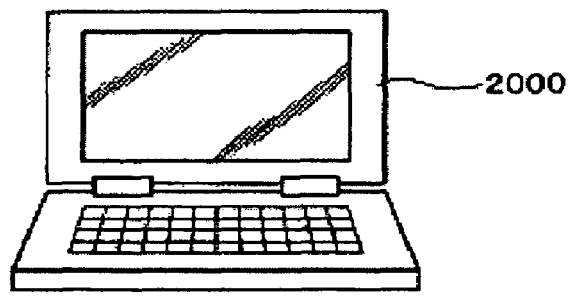
FIG. 12 is a view illustrating an electronic apparatus having an electronic component manufactured by the method of the first embodiment of the invention.
Figure 13:
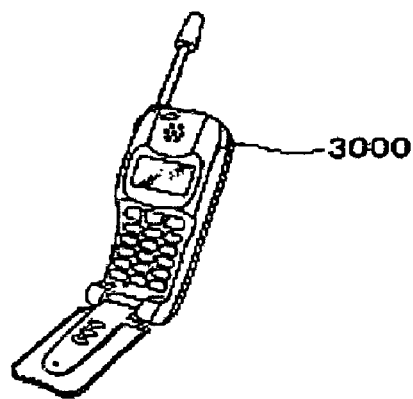
FIG. 13 is a view illustrating an electronic apparatus having an electronic component manufactured by the method of the first embodiment of the invention.

The method for manufacturing an electronic component of the first embodiment may further include a process for punching out a part of the electronic component 1. The part may be punched out after cutting the electronic component 1. In this case, the part of the electronic component 1 may be punched out along a line 36 shown in FIG. 8. The line 36 may be provided so as to be extended from the cut line 32 as shown in FIG. 8. As a result, the electronic component 2 shown in FIG. 9 may be manufactured. The wiring substrate 10 has been cut along the line 30 in the previous process. The line 30 intersects with the outline of the reinforcing member 20. Cutting the regions each having a different thickness is not required in the process. Accordingly, the base substrate 12 can be prevented from additional cracks produced when the electronic component 1 is punched out. As a result, an electronic component having high reliability can be manufactured. The electronic component 2 includes the base substrate 12. The base substrate 12 includes the crack 34. The electronic component 2 includes the wiring pattern 18 provided to the first surface 14 of the base substrate 12. The electronic component 2 includes the reinforcing member 20 provided to the second surface 16 of the base substrate 12. The electronic component 2 includes the reinforcing sticker 50 attached to the base substrate 12 so as to cover at least a part of the crack 34. Accordingly, an electronic component having high reliability, which can prevent the crack 34 from being developed, can be provided. In the electronic component 2, the semiconductor chip 11 may be mounted. In this case, the electronic component may be called as a semiconductor device. The semiconductor chip 11 may be mounted to the wiring substrate 10. In this case, the wiring substrate 10 to which the semiconductor chip 11 is mounted may be subjected to the above-described cutting process. In contrast, the semiconductor chip 11 may be mounted after the cutting process. In this case, the wiring substrate 10 having no semiconductor chip may be subjected to the cutting process. Besides, FIG. 10 illustrates an electronic module 1000 having the electronic component 2. The electronic module 1000 may be a display device. For the display device, a liquid crystal display device and an electroluminescence (EL) display device may be exemplified. The electronic module 1000 can be electrically connected to a circuit substrate 52 by using the terminal part 48 as shown in FIGS. 11A and 11B. In this case, the electrical and physical connection between the electronic module 1000 and the circuit substrate 52 may be realized by inserting the terminal part 48 into a connector 54 of the circuit substrate 52 as shown in FIGS. 11A and 11B. As aforementioned, since the reinforcing member 20 is provided to the terminal part 48, the terminal part 48 can easily be inserted into the connector 54. In addition, as an electronic apparatus having the electronic component 2, a notebook personal computer 2000 is illustrated in FIG. 12, while a cellular phone 3000 is illustrated in FIG. 13.

First Modification

Figure 14:
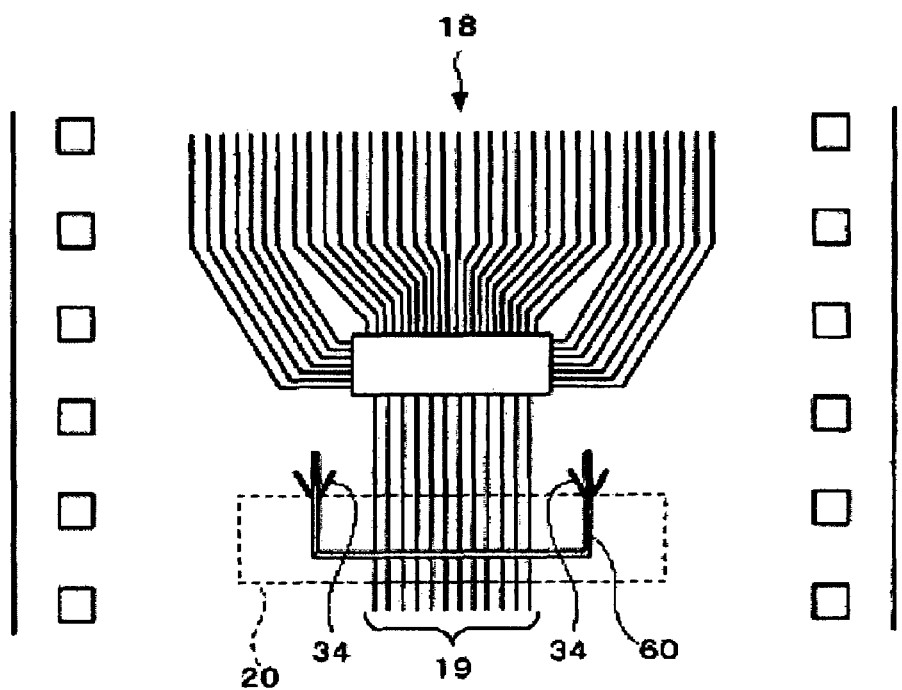
FIG. 14 is an explanatory view illustrating the method for manufacturing an electronic component according to a first modification of the first embodiment of the invention.

FIG. 14 is an explanatory view illustrating the method for manufacturing an electronic component according to a first modification of the first embodiment of the invention.

The method for manufacturing an electronic component according to the first modification of the first embodiment includes forming an opening 60 extended along the line 30 (refer to FIG. 3), in the wiring substrate 10 shown in FIG. 14 by carrying out a cutting process on the wiring substrate 10. The cutting process may also be carried out by shearing. The cutting process also may be carried out by a press-cutting in which the substrate 10 is cut by adding a pressure on a cutting tool of Thomson molds, sculptured molds, and pinnacle molds, etc., while attaching the cutting tool to the substrate 10. If the line 30 intersects with the wirings 19 (refer to FIG. 3), the process may include pressing a region, in which the opening 60 is formed, of the wiring substrate 10 from the first surface 14 side. As a result, an electronic component having high reliability, in which the wirings 19 are hardly delaminated, can be manufactured. In this case, the cutting process may be curried out by a cutting jig having an end surface that is the same shape of the opening 60.

Figure 15:
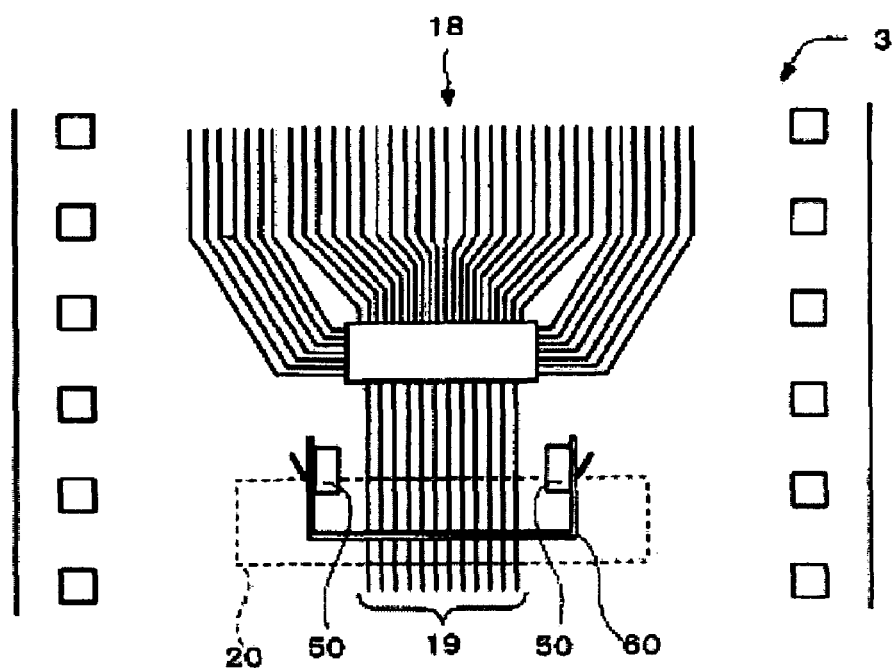
FIG. 15 is an explanatory view illustrating the method for manufacturing an electronic component according to the first modification of the first embodiment of the invention.

The method for manufacturing an electronic component of the first modification of the first embodiment includes attaching the reinforcing sticker 50 on the base substrate 12 so as to cover at least a part of the crack 34 produced in the base substrate 12 as shown in FIG. 15. The reinforcing sticker 50 may be provided so as to cover from the region in which the base substrate 12 and the reinforcing member 20 are overlapped to the region in which the base substrate 12 and the reinforcing member 20 are not overlapped. The reinforcing sticker 50 may be provided so as to overlap with at least a part of the end part of the reinforcing member 20. The reinforcing sticker 50 may be provided so that a part of the end part of the sticker 50 is along the opening 60. The reinforcing sticker 50 may be provided so that it overlaps with a part of the reinforcing member 20 and a part of the end part of the sticker 50 is along the opening 60. As a result, the electronic component 3 shown in FIG. 15 may be manufactured.

The method for manufacturing an electronic component of the first modification of the first embodiment may further include punching out a part of the electronic component 3 by shearing the electronic component 3. In this case, the part of the electronic component 3 may be punched out along a line (not shown) continuously connected to the opening 60. By punching out a part of the electronic component 3, the electronic component 2 may be manufactured (refer to FIG. 9).

Second Modification

Figure 16:
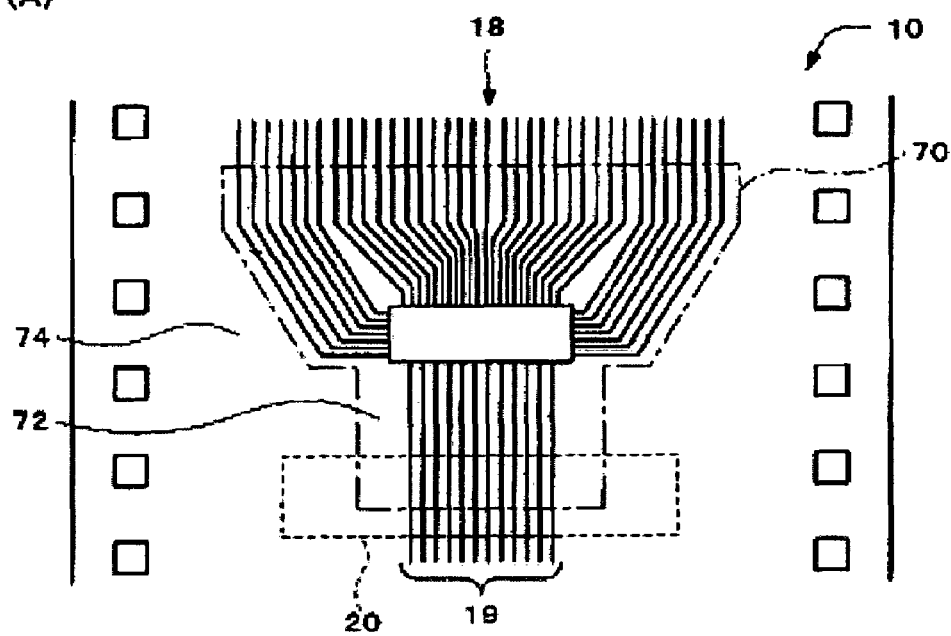
FIGS. 16A and 16B are explanatory views illustrating the method for manufacturing an electronic component according to a second modification of the first embodiment of the invention.
Figure 16:
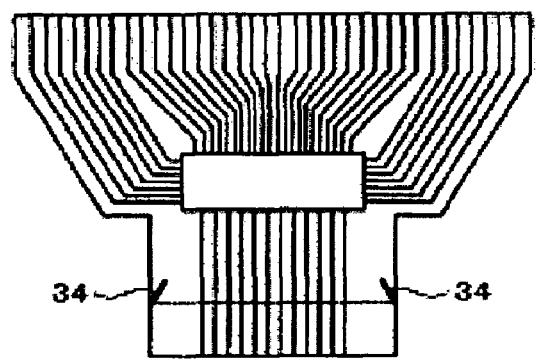

FIGS. 16A and 16B are explanatory views illustrating the method for manufacturing an electronic component according to a second modification of the first embodiment of the invention.

The method for manufacturing an electronic component according to the second modification of the first embodiment includes cutting the wiring substrate 10 along a line 70 by carrying out a cutting process on the wiring substrate 10. The cutting process may also be carried out by shearing. The cutting process also may be carried out by a press-cutting in which the substrate 10 is cut by adding a pressure on a cutting tool of Thomson molds, sculptured molds, and pinnacle molds, etc., while attaching the cutting tool to the substrate 10. The line 70 intersects with the outline of the reinforcing member 20 as shown in FIG. 16A. The wiring substrate 10 includes a first part 72 surrounded with the line 70, and a second part 74 outside of the line 70. That is, the line 70 is a surrounding line that surrounds the first part 72. According to the process, the first part 72 is punched out from the wiring substrate 10 (refer to FIG. 16B). In this case, the occurrence of the crack 34 in the first part 72 may be tolerated as shown in FIG. 16B. The process may include pressing the first part 72 from the second surface 16 side with a cutting jig. In this case, the first part 72 may be pressed from the second surface 16 side with a cutting jig having an end surface that is the same shape of the first part 72. By pressing the first part 72 from the second surface 16 side, an electronic component having high reliability, in which the wirings 19 are hardly delaminated, can be manufactured.

The method for manufacturing an electronic component of the second modification of the first embodiment includes attaching the reinforcing sticker 50 on the base substrate 12 so as to cover at least a part of the crack 34 produced in the base substrate 12 during the cutting process. The reinforcing sticker 50 may be provided so as to cover from the region in which the base substrate 12 and the reinforcing member 20 are overlapped to the region in which the base substrate 12 and the reinforcing member 20 are not overlapped. The reinforcing sticker 50 may be provided so as to overlap with at least a part of the end part of the reinforcing member 20. The reinforcing sticker 50 may be provided so that a part of the end part of the sticker 50 is along the line 70. The reinforcing sticker 50 may be provided so that it overlaps with a part of the reinforcing member 20 and a part of the end part of the sticker 50 is along the line 70. As a result, the electronic component 2 may be manufactured (refer to FIG. 8).

Second Embodiment

Figure 17:
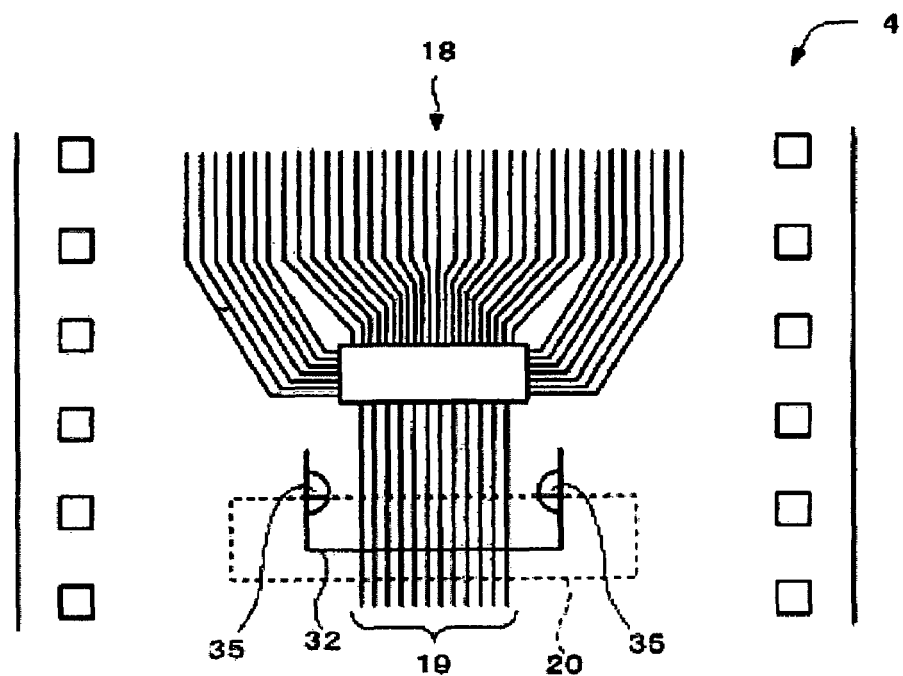
FIG. 17 is an explanatory view illustrating the method for manufacturing an electronic component according to a second embodiment of the invention.
Figure 18:
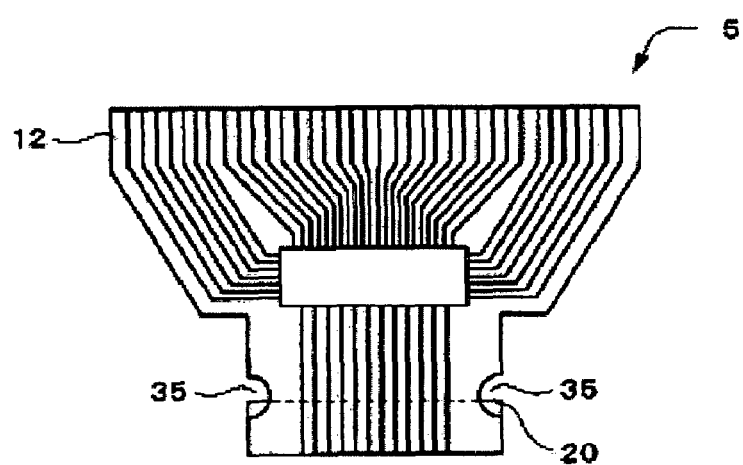
FIG. 18 is an explanatory view illustrating the method for manufacturing an electronic component according to the second embodiment of the invention.

FIGS. 17 and 18 are explanatory views illustrating the method for manufacturing an electronic component according to a second embodiment of the invention.

The method for manufacturing an electronic component according to the second embodiment includes cutting the wiring substrate 10 along a line 32 shown in FIG. 17 by carrying out a cutting process on the wiring substrate 10. The cutting process may also be carried out by shearing. The cutting process also may be carried out by a press-cutting in which the substrate 10 is cut by adding a pressure on a cutting tool of Thomson molds, sculptured molds, and pinnacle molds, etc., while attaching the cutting tool to the substrate 10. The method for manufacturing an electronic component of the second embodiment includes forming a notch 35 shown in FIG. 17. The notch 35 may be provided so as to cover from the region in which the base substrate 12 and the reinforcing member 20 are overlapped to the region in which the base substrate 12 and the reinforcing member 20 are not overlapped. The notch 35 may be provided so as to overlap with at least a part of the end part of the reinforcing member 20. The notch 35 may be provided so that a part of the end part of the sticker 50 is along the cut line 32. The notch 35 may be provided so that it overlaps with a part of the end part of the reinforcing member 20, and a part of the end part of the reinforcing sticker 50 is along the cut line 32. The notch 35 is formed to a part in which the crack 34 easily occurs. The notch 35 removes the crack 34 even if the crack 34 occurs in the cutting process. As a result, an electronic component having high reliability, which can prevent the crack 34 from being developed, can be manufactured. In the process, a region including the crack 34 (referred to FIG. 4) produced during the cutting process may be removed from the base substrate 12. By removing the region including the crack 34 from the base substrate 12, an electronic component having high reliability, which can prevent the crack 34 from being developed, can be manufactured. The process may be carried out by applying any of known methods. As a result, the electronic component 4 shown in FIG. 17 may be manufactured.

The method for manufacturing an electronic component of the second embodiment may further include punching out a part of the electronic component 4. By punching out the part of the electronic component 4, an electronic component 5 shown in FIG. 18 may be manufactured. The method for punching out the part of the electronic component 4 is not specifically limited, but any of known methods can be applied. In the electronic component 5, the base substrate 12 includes the notch 35 exposing the corner part of the reinforcing member 20, as shown in FIG. 18.

The invention is not limited to the above-described embodiments. Various modifications can be made. For example, the invention includes configurations that are substantively the same as those of described in the embodiments (for example, configurations including the same functions, methods, and results or configurations including the same aims and results). In addition, the invention includes configurations obtained by replacing non-essential parts of the configurations described in the embodiments. The invention further includes configurations that can achieve the same advantageous effects or aims as those described in the embodiments. In addition, the invention includes configurations obtained by adding the related art to the configurations described in the embodiments.

What is claimed is:

1. An electronic component, comprising:
a base substrate having a first surface and a second surface;
a wiring pattern positioned on the first surface of the base substrate;
a reinforcing member positioned on the second surface of the base substrate;
a reinforcing sticker positioned on the first surface of the base substrates; and
a semiconductor chip positioned on the first surface of the base substrate, a portion of the wiring pattern being positioned between the semiconductor chip and the first surface of the base substrate, and the reinforcing member not overlapping with the semiconductor chip.

2. An electronic component, comprising:
a base substrate having a first surface and a second surface;
a wiring pattern positioned on the first surface of the base substrate, the wiring pattern including a plurality of wirings extending to an edge portion of the base substrate;
a reinforcing member positioned on the second surface of the base substrate, the reinforcing member overlapping with a part of the plurality of wirings and an edge portion of the base substrate, the reinforcing member overlapping with a first portion of the first surface of the base substrate, the reinforcing member not overlapping with a second portion of the first surface of the base substrate; and
a reinforcing sticker positioned on the first surface of the base substrate, the reinforcing sticker being formed to cover a border between the first portion of the first surface of the base substrate and the second portion of the first surface of the base substrate.

3. The electronic component according to claim 1, wherein the reinforcing sticker is positioned at the part of the edge of the base substrate and does not overlap the wiring pattern.

4. The electronic component according to claim 2, wherein the reinforcing sticker is positioned at a part of an edge of the base substrate and does not overlap the wiring pattern.

5. An electronic component. comprising:
a base substrate having a first surface and a second surface;
a wiring pattern positioned on the first surface of the base substrate;
a reinforcing member positioned on the second surface of the base substrate; and
a reinforcing sticker positioned on the first surface of the base substrate, wherein the first surface of the base substrate has a first portion and a second portion, the first portion overlapping with the reinforcing member, the second portion not overlapping with the reinforcing member the crack being positioned at a border between the first portion and the second portion, the reinforcing sticker covering the crack.

6. An electronic component, comprising:
a base substrate having a first surface and a second surface, the first surface of the base substrate having a first portion and a second portion;
a wiring pattern positioned on the first surface of the base substrate;
a reinforcing member positioned on the second surface of the base substrate, the reinforcing member overlapping with the first portion of the first surface of the base substrate, the reinforcing member not overlapping with the second portion of the first surface of the base substrate; and a reinforcing sticker positioned on the first surface of the base substrate, the reinforcing sticker overlapping with a part of the first portion and a part of the second portion.

7. The electronic component according to claim 1, wherein the reinforcing member overlaps with a portion of the base substrate.

8. The electronic component according to claim 1, wherein the reinforcing sticker overlaps with a portion of the reinforcing member.

9. An electronic component, comprising:
   a base substrate having a first surface and a second surface;
   a semiconductor chip positioned on the first surface of the base substrate;
   a wiring pattern positioned on the first surface of the base substrate, a portion of the wiring pattern being positioned between the semiconductor chip and the first surface of the base substrate;
   a reinforcing member positioned on the second surface of the base substrate, the reinforcing member not overlapping with the semiconductor chip; and
   a reinforcing sticker positioned on the first surface of the base substrate.

10. The electronic component according to claim 9, wherein the reinforcing sticker is positioned at a part of an edge of the base substrate and does not overlap the wiring pattern.

11. The electronic component according to claim 9, wherein the first surface of the base substrate has a first portion and a second portion, the first portion overlapping with the reinforcing member, the second portion not overlapping with the reinforcing member, and the reinforcing sticker overlapping with a part of the first portion and a part of the second portion.

12. The electronic component according to claim 9, wherein the first surface of the base substrate has a crack at a part of an edge of the base substrate.

13. The electronic component of claim 1, wherein the first surface of the base substrate has a crack at a part of an edge of the base substrate.

* * * * *